United States Patent
Shu et al.

(10) Patent No.: US 10,877,731 B1
(45) Date of Patent: Dec. 29, 2020

(54) PROCESSING ARRAY DEVICE THAT PERFORMS ONE CYCLE FULL ADDER OPERATION AND BIT LINE READ/WRITE LOGIC FEATURES

(71) Applicant: GSI Technology, Inc., Sunnyvale, CA (US)

(72) Inventors: Lee-Lean Shu, Sunnyvale, CA (US); Bob Haig, Sunnyvale, CA (US); Chao-Hung Chang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/445,006

(22) Filed: Jun. 18, 2019

(51) Int. Cl.
*G11C 11/419* (2006.01)
*G06F 7/501* (2006.01)
*H03K 19/21* (2006.01)

(52) U.S. Cl.
CPC ............ *G06F 7/501* (2013.01); *G11C 11/419* (2013.01); *H03K 19/21* (2013.01)

(58) Field of Classification Search
CPC ........ G06F 7/501; G11C 11/419; H03K 19/21
See application file for complete search history.

(56) References Cited

U.S. PATENT DOCUMENTS

| | | |
|---|---|---|
| 3,451,694 A | 6/1969 | Hass |
| 3,747,952 A | 7/1973 | Graebe |
| 3,795,412 A | 3/1974 | John |
| 4,227,717 A | 10/1980 | Bouvier |
| 4,308,505 A | 12/1981 | Messerschmitt |
| 4,587,496 A | 5/1986 | Wolaver |
| 4,594,564 A | 6/1986 | Yarborough, Jr. |
| 4,677,394 A | 6/1987 | Vollmer |
| 4,716,322 A | 12/1987 | D'Arrigo et al. |
| 4,741,006 A | 4/1988 | Yamaguchi et al. |
| 4,856,035 A | 8/1989 | Lewis |
| 5,008,636 A | 4/1991 | Markinson |
| 5,302,916 A | 4/1994 | Pritchett |
| 5,375,089 A | 12/1994 | Lo |
| 5,382,922 A | 1/1995 | Gersbach |
| 5,400,274 A | 3/1995 | Jones |
| 5,473,574 A | 12/1995 | Clemen et al. |
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |

(Continued)

FOREIGN PATENT DOCUMENTS

| | | |
|---|---|---|
| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)

*Primary Examiner* — Kurtis R Bahr

(57) ABSTRACT

A processing array that performs one cycle full adder operations. The processing array may have different bit line read/write logic that permits different operations to be performed.

27 Claims, 12 Drawing Sheets

(56) References Cited

U.S. PATENT DOCUMENTS

| | | |
|---|---|---|
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,005,794 A | 12/1999 | Sheffield et al. |
| 6,044,034 A | 3/2000 | Katakura |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,310,880 B1 | 10/2001 | Waller |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao |
| 6,789,209 B1 | 9/2004 | Suzuki et al. |
| 6,816,019 B2 | 11/2004 | Delbo' et al. |
| 6,836,419 B2 | 12/2004 | Loughmiller |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,975,554 B1 * | 12/2005 | Lapidus ............ G11C 11/419 |
| | | 365/189.02 |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee et al. |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |

(56) References Cited

U.S. PATENT DOCUMENTS

| | | |
|---|---|---|
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Shu et al. |
| 8,488,408 B1 | 7/2013 | Shu et al. |
| 8,493,774 B2 | 7/2013 | Kung |
| 8,526,256 B2 | 9/2013 | Gosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Bo |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,685,210 B1* | 6/2017 | Ghosh ................ G06F 12/00 |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Chuang et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu |
| 10,388,364 B2 | 8/2019 | Ishizu et al. |
| 10,425,070 B2 | 9/2019 | Chen et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1* | 8/2007 | Lambrache ............ G11C 8/00 365/230.05 |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose |
| 2009/0141566 A1 | 6/2009 | Arsovski |
| 2009/0154257 A1 | 6/2009 | Fukaishi et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |

(56) References Cited

U.S. PATENT DOCUMENTS

| | | |
|---|---|---|
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ish Iku Ra |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1* | 1/2015 | Iyer .......... G11C 8/16 365/154 |
| 2015/0029782 A1 | 1/2015 | Jung |
| 2015/0063052 A1* | 3/2015 | Manning .......... G06F 12/0646 365/230.01 |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwara |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1 | 8/2016 | Kumar |
| 2016/0247559 A1 | 8/2016 | Atallah et al. |
| 2016/0329092 A1* | 11/2016 | Akerib .......... G11C 11/418 |
| 2017/0194046 A1* | 7/2017 | Yeung, Jr. .......... G11C 8/16 |
| 2017/0345505 A1 | 11/2017 | Noel et al. |
| 2018/0122456 A1 | 5/2018 | Li |
| 2018/0123603 A1 | 5/2018 | Chang |
| 2018/0157621 A1* | 6/2018 | Shu .......... G06F 7/4824 |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu |
| 2020/0117398 A1 | 4/2020 | Haig et al. |
| 2020/0160905 A1 | 5/2020 | Charles et al. |
| 2020/0301707 A1 | 9/2020 | Shu et al. |

* cited by examiner

| WE | WBL | WBLb | D(n) |
|---|---|---|---|
| 0 | x | x | D(n-1) |
| 1 | 0 | 1 | 0 |
| 1 | 1 | 0 | 1 |
| 1 | 0 | 0 | D(n-1) |

D(n) is storage data on the current write cycle
D(n-1) is storage data before the current write cycle

| State | IN | | | OUT | |
|---|---|---|---|---|---|
| | Ain | Bin | Cin | Bout | Cout |
| 1 | 0 | 0 | 0 | 0 | 0 |
| 2 | 0 | 0 | 1 | 1 | 0 |
| 3 | 0 | 1 | 0 | 1 | 0 |
| 4 | 0 | 1 | 1 | 0 | 1 |
| 5 | 1 | 0 | 0 | 1 | 0 |
| 6 | 1 | 0 | 1 | 0 | 1 |
| 7 | 1 | 1 | 0 | 0 | 1 |
| 8 | 1 | 1 | 1 | 1 | 1 |

Figure 5

| State | IN | | | OUT | |
|---|---|---|---|---|---|
| | Ain | Bin | Cin | Bout | Cout |
| 2 | 0 | 0 | 1 | 1 | 0 |
| 4 | 0 | 1 | 1 | 0 | 1 |
| 5 | 1 | 0 | 0 | 1 | 0 |
| 7 | 1 | 1 | 0 | 0 | 1 |

PROCESSING ARRAY DEVICE THAT PERFORMS ONE CYCLE FULL ADDER OPERATION AND BIT LINE READ/WRITE LOGIC FEATURES

FIELD

The disclosure relates generally to a static random access memory cell that may be used for computations.

BACKGROUND

An array of memory cells, such as dynamic random access memory (DRAM) cells, static random access memory (SRAM) cells, content addressable memory (CAM) cells or non-volatile memory cells, is a well-known mechanism used in various computer or processor based devices to store digital bits of data. The various computer and processor based devices may include computer systems, smartphone devices, consumer electronic products, televisions, internet switches and routers and the like. The array of memory cells are typically packaged in an integrated circuit or may be packaged within an integrated circuit that also has a processing device within the integrated circuit. The different types of typical memory cells have different capabilities and characteristics that distinguish each type of memory cell. For example, DRAM cells take longer to access, lose their data contents unless periodically refreshed, but are relatively cheap to manufacture due to the simple structure of each DRAM cell. SRAM cells, on the other hand, have faster access times, do not lose their data content unless power is removed from the SRAM cell and are relatively more expensive since each SRAM cell is more complicated than a DRAM cell. CAM cells have a unique function of being able to address content easily within the cells and are more expensive to manufacture since each CAM cell requires more circuitry to achieve the content addressing functionality.

Various computation devices that may be used to perform computations on digital, binary data are also well-known. The computation devices may include a microprocessor, a CPU, a microcontroller and the like. These computation devices are typically manufactured on an integrated circuit, but may also be manufactured on an integrated circuit that also has some amount of memory integrated onto the integrated circuit. In these known integrated circuits with a computation device and memory, the computation device performs the computation of the digital binary data bits while the memory is used to store various digital binary data including, for example, the instructions being executed by the computation device and the data being operated on by the computation device.

More recently, devices have been introduced that use memory arrays or storage cells to perform computation operations. In some of these devices, a processor array to perform computations may be formed from memory cells. These devices may be known as in-memory computational devices.

Big data operations are data processing operations in which a large amount of data must be processed. Machine learning uses artificial intelligence algorithms to analyze data and typically require a lot of data to perform. The big data operations and machine learning also are typically very computationally intensive applications that often encounter input/output issues due to a bandwidth bottleneck between the computational device and the memory that stores the data. The above in-memory computational devices may be used, for example, for these big data operations and machine learning applications since the in-memory computational devices perform the computations within the memory thereby eliminating the bandwidth bottleneck.

An SRAM cell can be configured to perform basic Boolean operations such as AND, OR, NAND and NOR. This SRAM cell can also support a Selective Write operation. However, this SRAM cell cannot perform certain logic functions that may be desirable. For example, it is desirable to be able to implement an exclusive OR (XOR) logic function since the XOR logic function is frequently used in a search operation when the search key needs to be compared to the contents in storage.

One of the most basic operations of a graphics processing unit (GPU) is a floating point calculation. The floating point calculation may be performed by well-known full adder circuitry. In a described in U.S. patent application Ser. No. 15/708,181 filed on Sep. 19, 2017, the full adder may be performed in 4 clock cycles. However, it is desirable to be able to perform the full adder in a single clock cycle and it is to this end that the disclosure is directed.

BRIEF DESCRIPTION OF THE DRAWINGS

FIG. 3 illustrates a selective write truth table for the AND dual port SRAM cell of FIG. 1;

FIGS. 4 and 5 illustrate a full adder truth table for a full adder that may be implemented using the processing array with AND cells shown in FIG. 2;

DETAILED DESCRIPTION OF ONE OR MORE EMBODIMENTS

The disclosure is particularly applicable to a CMOS implemented memory cell and processing array with a plurality of the memory cells that are capable two logic computations that may be used to perform a full adder operation in a single clock cycle and it is in this context that the disclosure will be described. It will be appreciated, however, that the memory cell and processing array has greater utility and is not limited to the below disclosed implementations since the memory cell may be constructed using different processes and may have different circuit configurations than those disclosed below that perform the two computations and so are within the scope of this disclosure. For purposes of illustration, a dual port AND cell and a 3-port SRAM complementary XOR cell are disclosed below and in the figures. However, it is understood that the SRAM computation cell and processing array may also be implemented with an SRAM cell having three or more ports and the disclosure is not limited to the dual port SRAM cell disclosed below. It is also understood that the SRAM cell having three or more ports may be slightly differently constructed than the dual port SRAM shown in the figures, but one skilled in the art would understand how to construct those three or more port SRAMs for the disclosure below. Furthermore, although an SRAM cell is used in the examples below, it is understood that the disclosed memory cell for computation and the processing array using the memory cells may be implemented using various different types of memory cells including the DRAMs, CAMs, non-volatile memory cells and non-volatile memory devices and these implementations using the various types of memory cells are within the scope of the disclosure.

Figure 1:
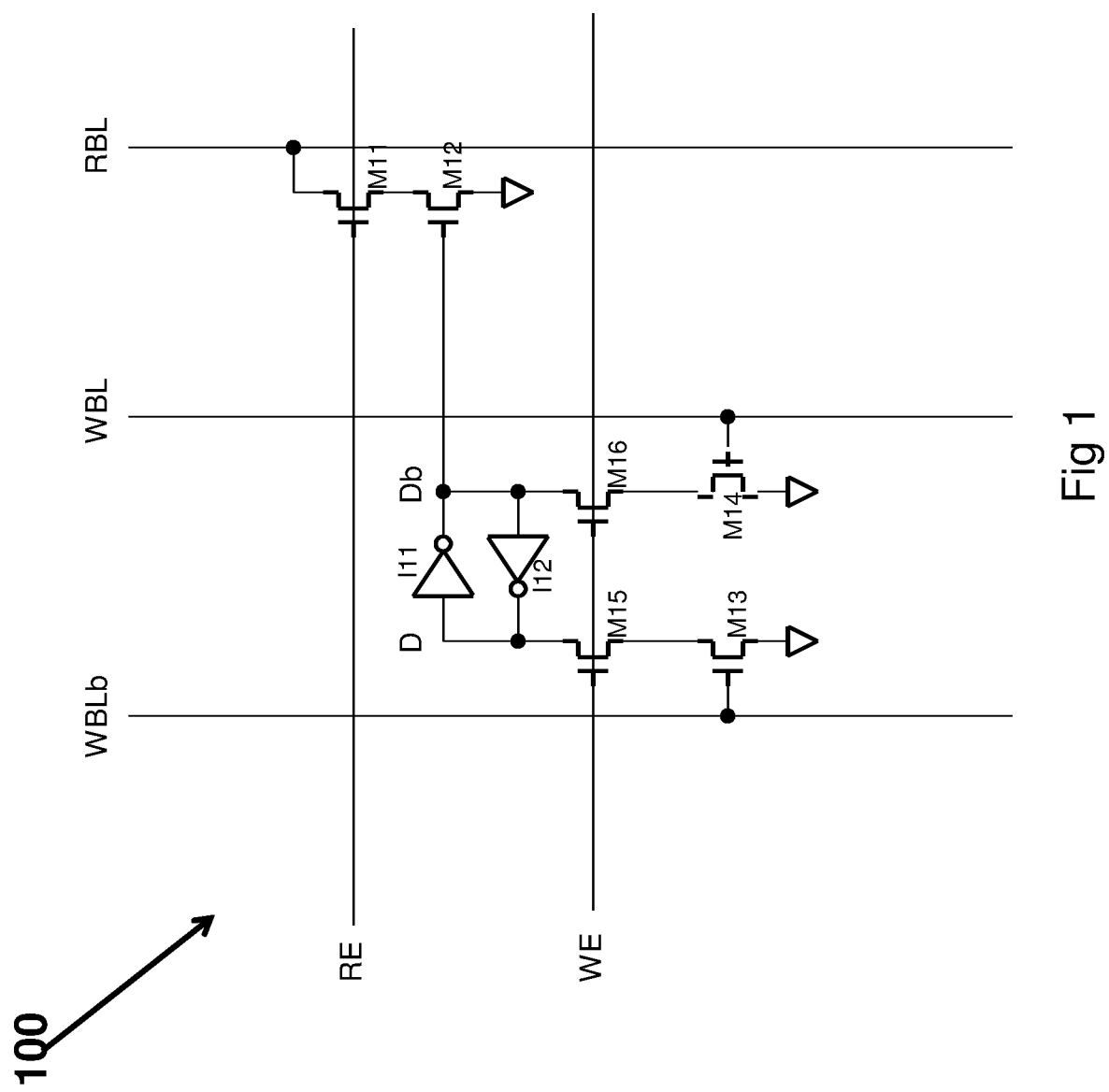
FIG. 1 illustrates an implementation of an AND cell with a read bit line.
Figure 2:
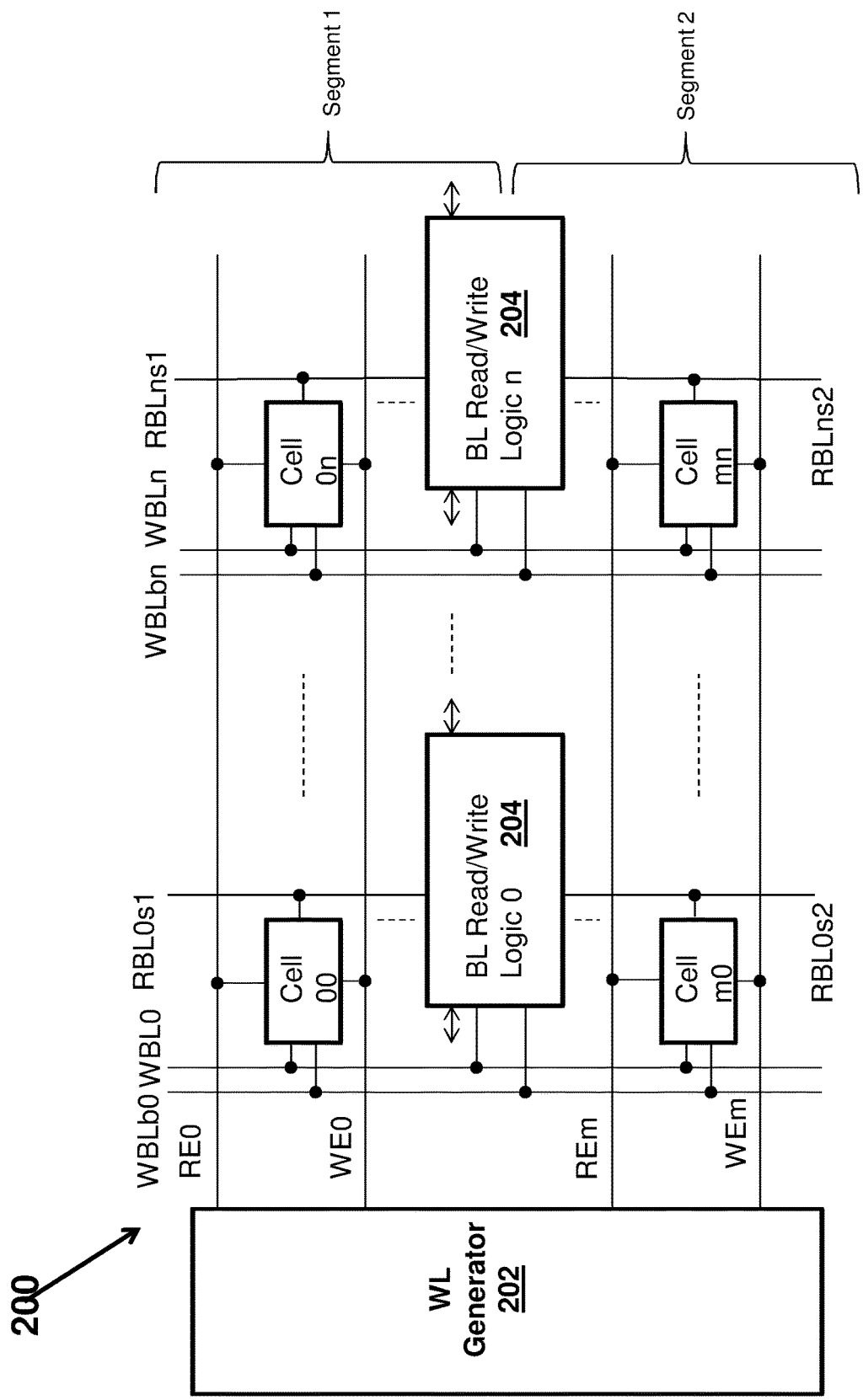
FIG. 2 illustrates an implementation of a first embodiment of a processing array that has a plurality of the AND cells shown in FIG. 1 and split segments.

FIG. 1 illustrates an implementation of a dual-port AND cell 100 that may be used in a processing array shown in FIG. 2 and used for computation. The cell 100 may have two cross coupled inverters I11, I12 and two access transistors M15 and M16 that are coupled together as shown in FIG. 1 to form an SRAM cell. The SRAM cell may be operated as a storage latch and may have a read port and a write port so that the SRAM cell is a dual port SRAM cell. The two inverters are cross coupled since the input of the first inverter is connected to the output of the second inverter and the output of the first inverter is coupled to the input of the second inverter as shown in FIG. 1. A Write Word line carries a signal and is called WE (see FIG. 1) and a write bit line and its complement are called WBL and WBLb, respectively. The Write word line (WE) is coupled to the gate of each of the two access transistors M15, M16 that are part of the SRAM cell. The SRAM cell may further include transistors M13, M14 whose gates are coupled to the write bit line and the complementary write bit line. The transistors M13, M14, M15 and M16 form the write port circuitry of the SRAM cell. The drain of each of those access transistors M15, M16 are coupled to each side of the cross coupled inverters (labeled D and Db in FIG. 1.)

The circuit in FIG. 1 may also have a read word line RE, a read bit line RBL and a read port formed by transistors M11, M12 coupled together to form an isolation circuit. The read word line RE may be coupled to the gate of transistor M11 that forms part of the read port while the read bit line is coupled to the drain terminal of transistor M11. The gate of transistor M12 may be coupled to the Db output from the cross coupled inverters 121, 122 and the source of transistor M12 may be coupled to ground.

In operation, the dual port SRAM cell may read data stored in the latch using a signal on the read word line (RE) to address/activate the dual port SRAM cell and the read bit line (RBL) to read the data stored in the dual port SRAM cell. The dual port SRAM cell may write data into the dual port SRAM cell by addressing/activating the dual port SRAM cell using a signal on the write word line (WE) and then writing data into the dual port SRAM cell using the word bit lines (WBL, WBLb).

During reading, multiple cells (with only a single cell being shown in FIG. 1 but multiple cells shown in FIG. 2) can be turned on to perform an AND function between the data stored in the cells that were turned on. For example, a number of cells in a column of the processing array 200 in FIG. 2, such as cell 00, . . . , cell m0, may be activated by the RE signal for each of those cells. Thus, at the beginning of the read cycle, RBL is pre-charged high and if the Db signal of all cells that are turned on by RE are "0", then RBL stays high since, although the gate of transistor M11 is turned on by the RE signal, the gate of M12 is not turned on since the Db signal is low. As a result, the RBL line is not connected to the ground to which the source of transistor M12 is connected and the RBL line is not discharged. The cell 20 may operate as dual-port SRAM cell. The write operation is activated by WE and the data is written by toggling of WBL and WBLb. The read operation is activated by RE and the read data is accessed on RBL. The cell 100 may further be used for computation where RBL is also used for logic operation. If the Db signal of any or all of the cells is "1" then RBL is discharged to 0 since the gate of M12 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

The Db signal of the cell 100 may be coupled to a gate of transistor M12 to drive the RBL line. However, unlike the typical 6T cell, the Db signal is isolated from the RBL line and its signal/voltage level by the transistors M11, M12 (together forming the isolation circuit). Because the Db signal/value is isolated from the RBL line and signal/voltage level, the Db signal is not susceptible to the lower bit line level caused by multiple "0" data stored in multiple cells in contrast to the typical SRAM cell. Therefore, for the cell in FIG. 1, there is no limitation of how many cells can be turned on to drive RBL. As a result, the cell (and the device made up of multiple cells) offers more operands for the Boolean functions such as AND function described above and NOR/OR/NAND functions and search operation described below since there is no limit of how many cells can be turned on to drive RBL. Furthermore, in the cell in FIG. 1, the RBL line is pre-charged (does not use a static pull up transistor as with the typical 6T cell) so this cell can provide much faster sensing because the current generated by the cell is all being used to discharge the bit line capacitance with no current being consumed by a static pull up transistor so that the bit line discharging rate can be more than 2 times faster than the typical SRAM cell. The sensing for the disclosed cell also requires less power without the extra current consumed by a static pull up transistor and the discharging current is reduced by more than half.

In addition to the AND function described above, the SRAM cell 100 in FIG. 1 also may perform a NOR function by storing inverted data. Specifically, if D is stored at the gate of M12, instead of Db, then RBL=NOR (D0, D1, etc.). One skilled in the art understand that the cell configuration shown in FIG. 1 would be slightly altered to achieve this, but that modification is within the scope of the disclosure.

Transistors M13, M14, M15 and M16 form a write port. This cell can be arrayed in the array device 200 as shown in FIG. 2 with WE running horizontally and WBL and WBLb running vertically. FIG. 3 shows the truth table of the write port. If WE is 0, no write is performed. If WE is 1, then the storage nodes D and its complement Db are written by WBL and WBLb. Specifically, D=1 and Db=0 if WBL=1 and WBLb=0 and D=0 and Db=1 if WBL=0 and WBLb=1. If both WBL and WBLb are 0, then no write is performed and the data storage is the data storage in the storage element before the current write cycle (D(n−1) as shown in FIG. 3. Thus, this cell can perform Selective Write function with WBL=WBLb=0. In the cell, M15 and M16 are activated by the write word line (WE) signal coupled to the gate of M15 and M16 to perform the Selective Write operation.

Returning to FIG. 1, WBL and WBLb lines are driving the gate of transistors M14 and M13. Unlike the standard 6T SRAM cell, The writing to the cell does not require to un-latch the cell nodes, therefore, driver strength of WBL and WBLb is not limited by the number of the cells turned on. On Selective Write operation, WBL and WBLb do not require a strong device to hold the WBL and WBLb signal level, and there is no limitation how many cells can be turned on.

The write port is form by 2 transistors in series, M13 in series with M15 and M14 in series with M16. FIG. 1 shows M15 and M16 gated by WE are coupled to D and Db and coupled to the drains of M13 and M14. The write port can function the same way if M13 and M15 is swapped and M14 and M16 is swapped such that the sources of M15 and M16 are coupled to ground. Furthermore, M15 and M16 coupled to ground can be merged into one transistor (drains of both transistors shorted together) and the write port still performs the same way.

Figure 7:
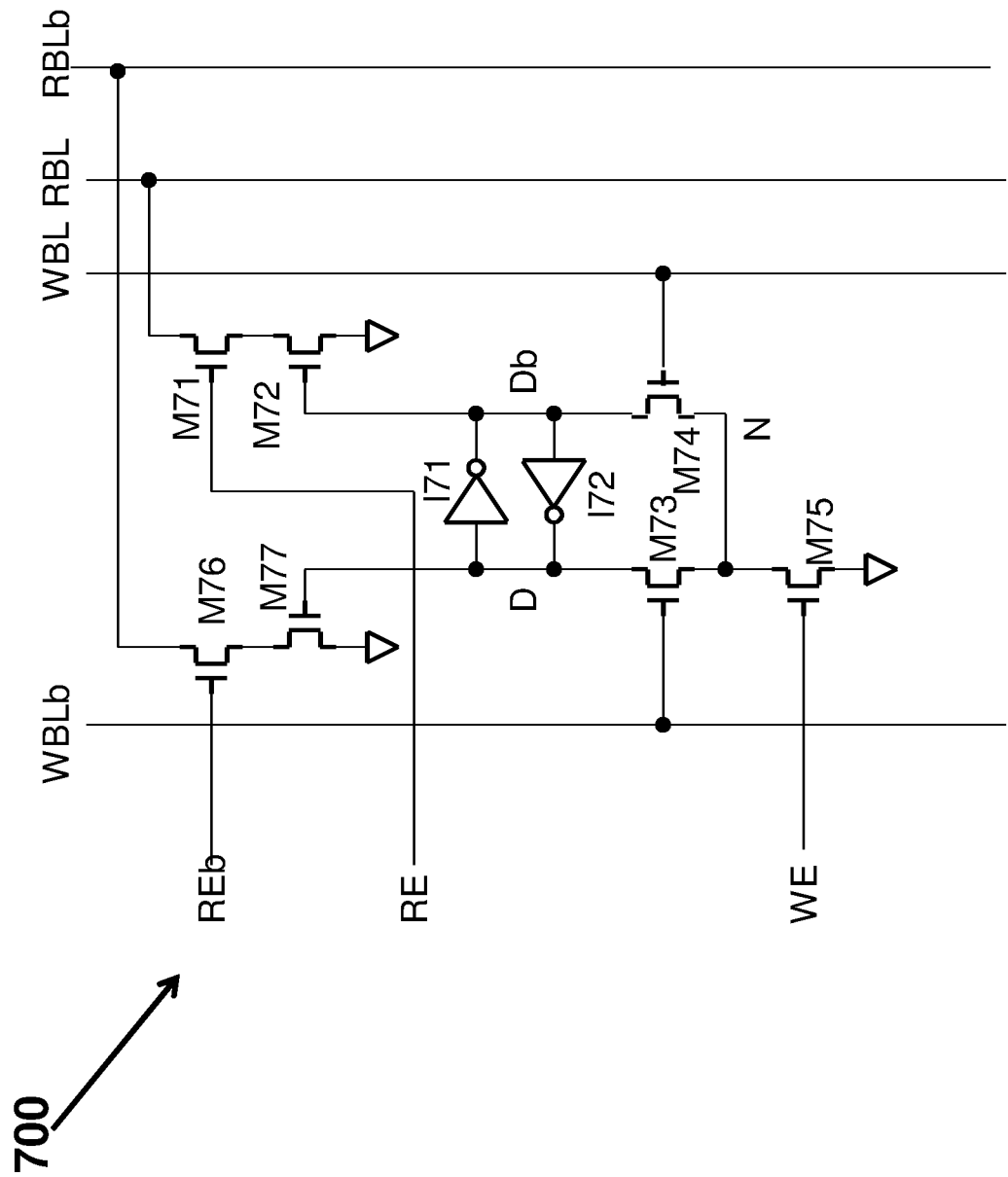
FIG. 7 illustrates an implementation of a complementary XOR cell with two read bit lines.

The storage cell/latch device (I11 and I12 in FIG. 1) can be a simple inverter. To do a successful writing, the driver strength of series transistor M13 and M15 needs to be stronger than the pull up PMOS transistor of I12 and this ratio needs to be around 2 to 3 times so that the driver strength of transistor M13 and M15 may optimally be 2-3 times stronger than the pull up PMOS transistor of I12. In advanced technology like 16 nm or better, the layout of the PMOS and NMOS transistors is preferred to have an equal length. So, when the cells of FIG. 7 are produced using 16 nm or better feature size, the PMOS transistor of I11 and I12 could be actually 2 or more PMOS transistors in series. For the ease of the layout, one or more of the series PMOS transistor could be tied to ground.

The read port transistors M11 and M12 (the isolation circuits) can be PMOS instead of NMOS. If transistors M11 and M12 are PMOS with the source of M12 coupled to VDD, then RBL is pre-charged to 0 and RBL is 1 if Db of one or more cells turned on is 0 and RBL is 0 if Db of all cells is 1. In other words, RBL=NAND (Db0, Db1, etc.)=OR (D0, D1, etc.), where D0, D1, etc. are the true data of the cells turned on and Db0, Db1, etc. are the complement data. It can also perform NAND function by storing inverted data such that if D is stored at the gate of M22, instead of Db, then RBL=NAND (D0, D1, etc.). Further details of this cell are disclosed in U.S. patent application Ser. No. 15/709,379, filed Sep. 19, 2017, Ser. No. 15/709,382, filed Sep. 19, 2017 and Ser. No. 15/709,385, filed Sep. 19, 2017, all of which are incorporated herein by reference.

FIG. 2 illustrates an implementation of a processing array 200 that has a plurality of the AND cells shown in FIG. 1 in an array (cell 00, . . . , cell mn in a plurality of columns (e.g., cell 00, . . . cell 0n) and rows (e.g., cell 00, . . . , cell m0)). Each read bit line has split segments with each of a plurality of bit line (BL) read/write logic circuitry 204 in the middle of each bit line. The processing array 200 may have a word line generator 202 that generates the word line signals/ voltage levels and the plurality of bit line read/write logic circuits (BL Read/Write Logic 0, . . . , BL Read/Write Logic n) 204 that receive and process the bit line signals to generate the results of the Boolean logic function/computations performed in each clock cycle. In this implementation, each bit line has two segments. Segment 1 has RBLs1 read bit line (RBL0s1, . . . , RBLns1) with number of cells connected on it which are all connected to the BL read/write circuitry 204. Segment 2 has RBLs2 lines (RBL0s2, . . . , RBLns2) with a number of cells which are all connected to another input of the BL read/write circuitry 204. In this example, WBL and WBLb are shared between the 2 segments.

In a read operation, WL generator 202 generates one or multiple RE signals in each segment to read a cell or form a Boolean function when multiple cells are turned on in each of RBLs1 and RBLs2. The BL Read/Write Logic 204 processes the inputs from RBLs1 and RBLs2 and sends the results back to its WBL/WBLb for writing/using in that cell, or to the neighboring BL Read/Write Logic for writing/using in that neighboring cell, or send it out of this processing array. Alternatively, the BL Read/Write logic 204 can store RBL result and/or RBLb result from its own bit line or from the neighboring bit line in a register or latch so that the next cycle Read/Write logic can perform logic with the latched RBL and/or RBLb result data.

In a write operation, the WL generator 202 generates one or more WE signals for the cells to be written and the BL Read/Write Logic 204 processes the write data, either from its own RBL or RBLb line, or from the neighboring RBL or RBLb line or from out of this processing array. The ability of BL Read/Write Logic 204 to process the data from the neighboring bit line means that the data can be shifting from one bit line to the neighboring bit line and one or more or all bit lines in the processing array may be shifting concurrently. The BL Read/Write Logic 204 can also decide not to write for a Selective Write operation based on RBL result and/or RBLb result. For example, WBL can be written to a data if RBL=1. If RBL=0, then a write is not performed.

Each BL Read/Write Logic 204 may have one or more Boolean logic circuits that perform various Boolean operations using the read bit lines as inputs. For example, each BL Read/Write Logic 204 may include one or more of AND, OR and/or XOR circuitry that may be implemented in various known manners and the disclosure is not limited to the particular implementation of the AND, OR and/or XOR circuitry in the BL Read/Write Logic 204.

Using the cell 100 in FIG. 1 and the processing array 200 shown in FIG. 2, the computation performed may be written as:

$$RBL = AND(D1, D2, \ldots, Dn) \tag{EQ1}$$

where D1, D2, . . . Dn are "n" number of data stored in the cells with the RE signal on/active The detailed RBL functions are disclosed in U.S. patent application Ser. No. 16/111,178, filed Aug. 23, 2018 that is incorporated herein by reference and will not be described further here.

FIGS. 4 and 5 illustrate a full adder truth table for a full adder that may be implemented using the processing array 200 with AND cells shown in FIG. 2. Ain and Bin are 2 full adder inputs and Cin is the carry input. Bout is the Sum output and Cout is the carry output. As shown in the truth table, two or more of the three inputs (Ain, Bin and Cin) being a logic "1" will generate Cout as a logic "1" and an odd number of three inputs being a logic "1" (one of the inputs being "1" or three of the inputs being "1") will generate Bout as a logic "1".

Using the processing array 200 and the cell 100 described above, the 3 inputs of the full adder may be stored in the cells along the same bit line and BL Read/Write Logic and thus the processing array may generate sum and carry outputs in the cells and BL Read/Write Logic after the logic operation. In this example implementation, the cell that stores the Bin input is shared as Sum output, Bout, and the cell that stores Cin cell may be shared as Carry output Cout.

In states 1, 3, 6 and 8 shown in FIG. 4, Bout=Bin and Cout=Cin. This means there is nothing needed to be done in the computation if the inputs are the 4 combinations of values shown in states 1, 3, 6 and 8 and the processing array will be able to generate the outputs without any logic operation. The subset of the states (2, 4, 5 and 7) where outputs are not the same as inputs (known as "calculated states") are shown in FIG. 5. In all calculated states, Ain and Cin are complementary value to each other. In the states in which the outputs do not need to change, Ain and Cinb are the same value. Therefore, the circuitry in the BL read write logic 204 may perform an operation that is XOR (Ain, Cin)=1, then the outputs of the full adder need to change. FIG. 5 also shows that Bout and the NOT(Cout) have the value as NOT(Bin) for all of the calculated states. Therefore, the circuitry in the BL read write logic 204 may perform an operation that If XOR (Ain, Cin)=1, then Bout=NOT(Cout)=NOT (Bin); and if XOR (Ain, Cin)=0, Bout and Cin do not change. In summary, the full Adder equations are written as $$Y1 = XOR(Ain, Cin) \tag{EQ2}$$

$$Bout = Bin, \text{if } Y1 = 0 \tag{EQ3}$$

$$Bout = NOT(Bin), \text{if } Y1 = 1 \tag{EQ4}$$

$$Cout = Cin, \text{if } Y1 = 0 \tag{EQ5}$$

$$Cout = Bin, \text{if } Y1 = 1 \tag{EQ6}$$

Figure 6:
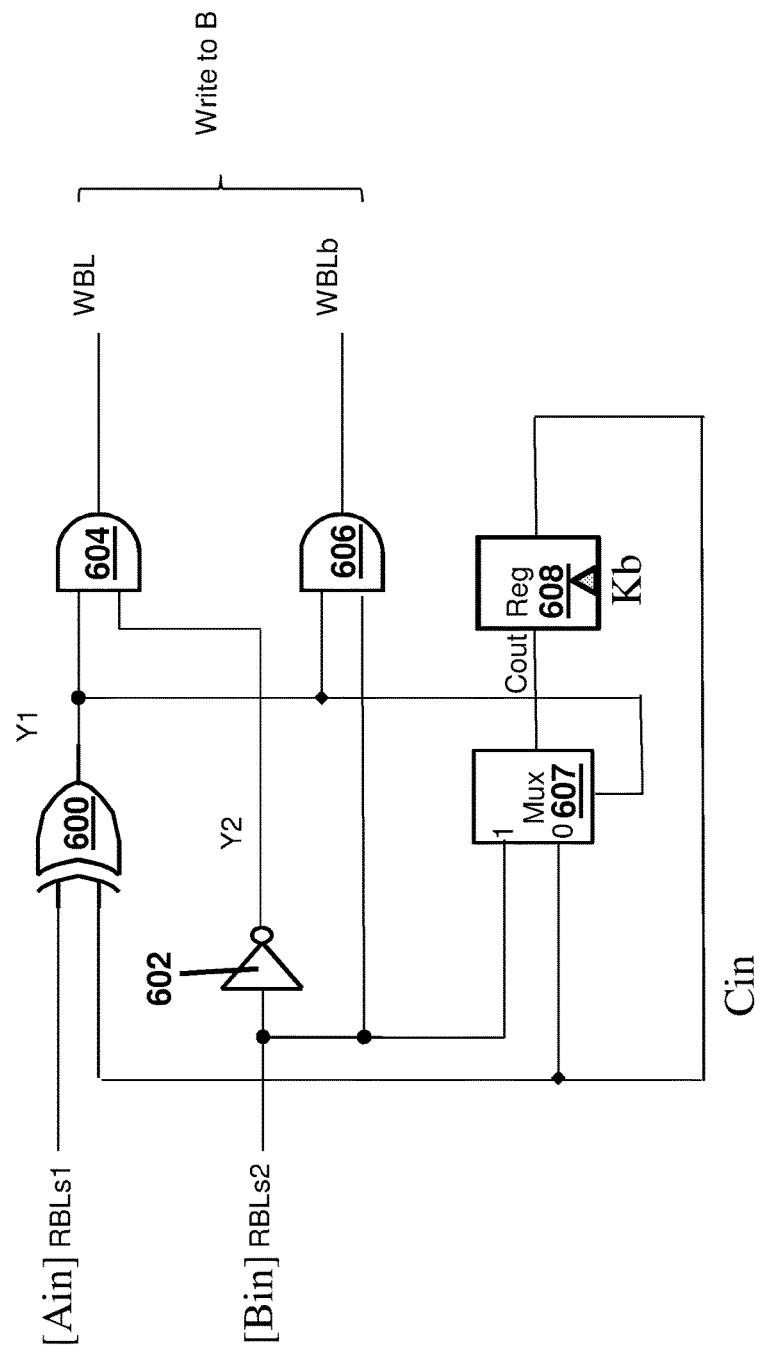
FIG. 6 illustrates an implementation of a first embodiment of the bit line read/write logic for the processing array shown in FIG. 2.

A non-limiting example of the circuitry of the BL read/write circuitry 204 is shown in FIG. 6 that performs the full adder operation in one clock cycle as described in EQ2 to EQ 6. In this implementation, Ain is stored in the cells in segment 1 and Bin is stored in the cells in segment 2. Cin is stored in a register or a latch in 608 in FIG. 6. During a read operation, the cells' statuses are as below:

1. Both RE of Ain and Bin cells are 1 during read operation in K clock high period resulting in:

$$a. \text{ RBL}s1 = Ain \tag{EQ7}$$

$$b. \text{ RBL}s2 = Bin \tag{EQ8}$$

2. Cin is registered/latched in Reg 608 from the prior Cout value.

An XOR gate 600 in FIG. 6 receives Ain and Cin and outputs signal Y1=XOR (RBLs1, Cin)=XOR (Ain, Cin) as shown in EQ2. An Inverter 602 is connected to RBLs2 and generates the Y2 signal resulting in:

$$Y2 = NOT(Bin) \tag{EQ9}$$

Y1 is a selective write control signal so that, if Y1=1, AND gates 604 and 606 are on, and:

$$WBL = Y2 = NOT(Bin) \tag{EQ10}$$

$$WBLb = Bin \tag{EQ11}$$

During a write operation, the WE signal of the B cell (cell storing Bin) is active and if Y1 is 1, then Y2, or NOT(Bin) is written into B cell. If Y1 is 0, then WBL=WBLb=0, no write is performed though WE of the B cell is on, the B cell retains the Bin value which completes the full adder logic for Bout as described in EQ3 and EQ4. The write operation may be performed in the second half of the normal memory clock cycle during the period when Kb is high, where Kb is the complementary clock signal of K. In this manner, the read is performed (to perform the computation) in the first half of the cycle when K is high and the write is performed in the second half of the cycle when Kb is high and therefore full adder logic for B is completed in one cycle.

In FIG. 6, Cout is the output of Mux 607 and Y1 controls the Mux 607. If Y1=1, then Cout=Bin. If Y1=0, then Cout=Cin Cout may be be registered by Kb and stored in Reg 608 and the output of register 608 forms Cin for the next cycle. As described above, Y1 and RBLs2 are generated in the first half of the cycle and Cin is also available in the first half of the cycle and then a new Cin for the next cycle is registered in the $2^{nd}$ half of the cycle. This completes the full adder logic for C in 1 cycle.

To do a 16-bit Adder, for example, we need to have 16 bits of Ain and Bin inputs and a register in the BL Read/Write logic 204 to store Cin so that 16 or more cells in each of segment 1 and segment 2 are needed for the 16 bit adder. Unlike Ain and Bin, Cin just needs 1 bit storage for a multiple bits full adder, so Cin is suitable to store in a register while Ain and Bin are stored in the memory cells of the processing array 200.

The implementation of the circuitry 204 in FIG. 6 can also combine an additional input to the full adder. For example, it may be desirable to have the full adder has an input such as X, Bin and Cin wherein X is an AND function of Ain and W. Ain and W may be 2 values stored on 2 cells along the same RBL, RBLs1, and X is formed as shown on EQ1 by turning on RE of both cells storing A and W. This function is particularly useful when using the processing array to perform a multiplication computation (acting as a Multiplier circuit) when the basic cell is a full adder with multiplicand an AND function of 2 inputs. Then, in the read operation, the cells' statuses are as below:

1. For Ain and W, RE=1 when read from segment 1. For Bin, RE=1 when read from segment 2. So $$a. \text{RBL}s1 = AND(Ain, W) = X \tag{EQ12}$$

$$b. \text{RBL}s2 = Bin \tag{EQ13}$$

2. Cin is stored in the Reg 608.

In this example, the full adder logic is performed with additional input W to AND with A, this is very useful in multiplication. The various full adder circuits described below using 3-port SRAM cell can also have additional input W which are within the scope of this disclosure.

Note that Ain, Bin, Cin and W are used in this example, but a person with skill in the art can easily uses the inversion of these parameters with slight modification of the circuit 204 to achieve the same result which are within the scope of this disclosure.

FIG. 7 illustrates an implementation of a 3 port complementary XOR cell 700 that may have two read bit lines and generate two logical computations each clock cycle. The 3-port SRAM cell 700 may include two cross coupled inverters 171, 172 and two access transistors M73 and M74 that are coupled together as shown in FIG. 7 to form the basic SRAM cell. The SRAM cell may be operated as a storage latch and may have 2 read ports (including the two read bit lines and transistors M71, M72, M76, M77) and a write port (including the write bit lines and transistors M73, M74, M75) to form a 3-port SRAM. The two inverters 171, 172 are cross coupled since the input of the first inverter is connected to the output of the second inverter (labeled D) and the output of the first inverter (labeled Db) is coupled to the input of the second inverter as shown in FIG. 7. The cross coupled inverters 171, 172 form the latch of the SRAM cell. The access transistor M74 and M73 may have their respective gates connected to a write bit line and its complement bit line (WBL, WBLb), respectively. A write word line carries a signal WE. The write word line WE is coupled to the gate of a transistor M75 that is part of the write access circuitry for the SRAM cell.

The circuit in FIG. 7 may also have a read word line RE, a complementary read word line REb, a read bit line RBL, a complementary read bit line RBLb and a read port formed by transistors M71, M72 coupled together and another read port formed by transistors M76, M77 coupled together. The read word line RE may be coupled to the gate of transistor M71 that forms one read port, the read bit line RBL is coupled to the drain terminal of transistor M71 to perform a first computation during each clock cycle. The read word line complimentary REb may be coupled to the gate of transistor M76 that forms another read port, the read bit line RBLb is coupled to the drain terminal of transistor M76 to perform a second computation during each clock cycle. The gates of transistor M72 and M77 may be coupled to the Db and D outputs from the cross coupled inverters 171, 172, respectively. The isolation circuit isolates the latch outputs Db and D (in the example in FIG. 7) from the signal/voltage level of RBL and RBLb so that the Db and D signals are not susceptible to the lower bit line level caused by multiple "0" data stored in multiple cells in contrast to the typical SRAM cell.

The cell 700 shown in FIG. 7 has the two read bit lines, RBL and RBLb. The two read bit lines allow two computations (one computation using each read bit line) to be performed each clock cycle. This cell 700 in the processing array 800 shown in FIG. 8 permits the faster calculation of a floating point calculation. For example, the processing array 800 with a plurality of cells 800 can perform full adder operation in a single clock cycle.

When the read ports of cell 700 are active, it may operate such that either RE or REb is high and the REb signal/voltage level is the complement of RE signal/voltage level. It may also operate such that RE or REb signal/voltage levels both high or both low. RBL is pre-charged high, and if the transistor pair M71, M72 are both turned on, RBL is discharged to 0. If either one of M71, M72 transistors is off, then RBL stay high as 1 since it was pre-charged high and not coupled to ground. RBLb is also pre-charged high, and if the transistor pair M76, M77 are both turned on, RBLb is discharged to 0. If either one of M76, M77 transistors is off, then RBLb stay high as 1 since it was pre-charged high and not coupled to ground. The cell 700 may operate as a 3-port SRAM cell. The write operation is activated by WE and the data is written by toggling of WBL and WBLb. The read operation is activated by RE and REb, the read data is accessed on RBL or RBLb. The cell 700 may further be used for computation where RBL and RBLb are also used for logic operation.

Figure 8:
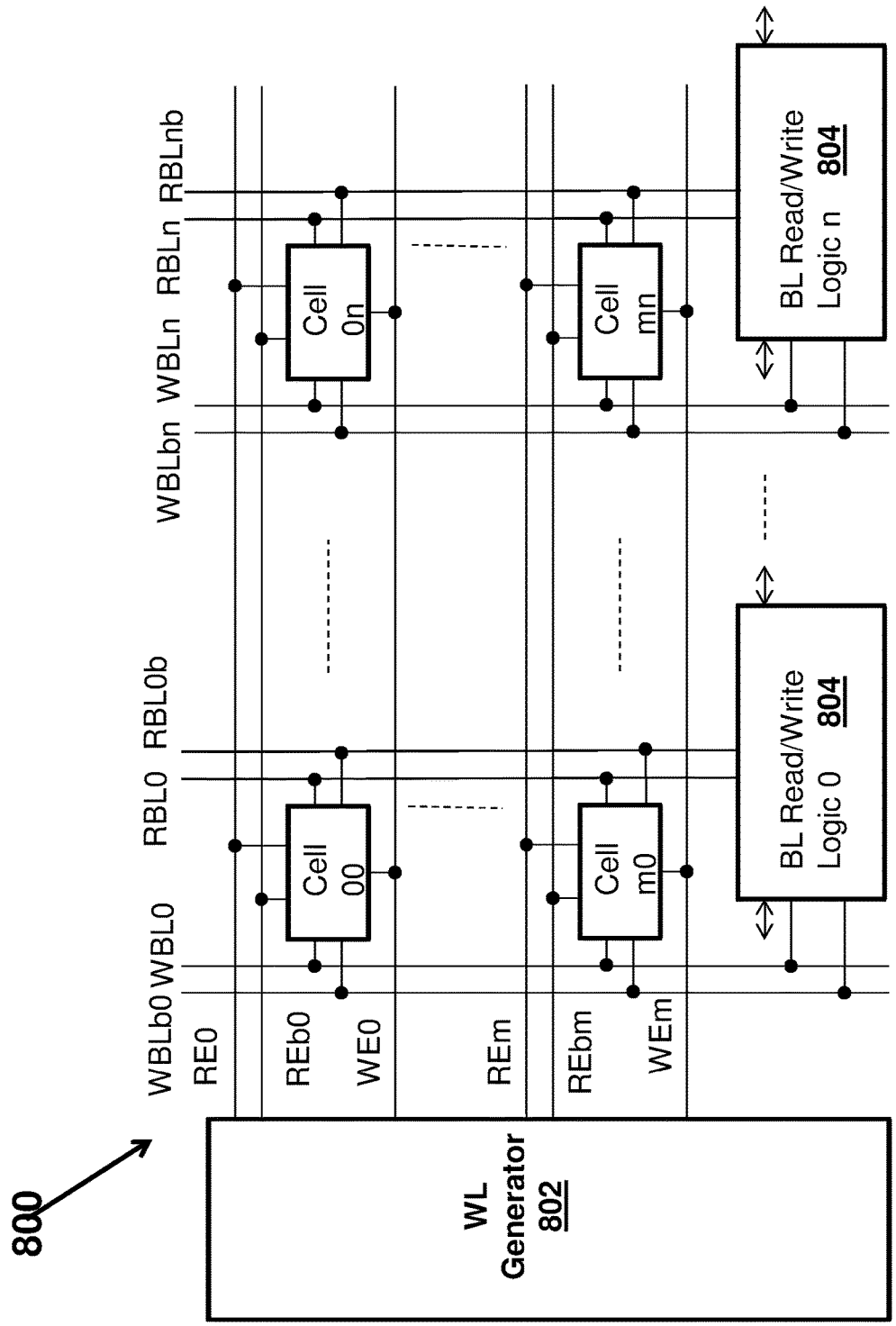
FIG. 8 illustrates an implementation of a second embodiment of a processing array that has a plurality of the complementary XOR cells shown in FIG. 7.

FIG. 8 illustrates an implementation of a processing array 800 that has a plurality of the complementary XOR cells shown in FIG. 7. The processing array 800 may have a word line generator 802 that generates the word line signals/voltage levels and a plurality of bit line read/write logic circuits (BL Read/Write Logic 0, . . . , BL Read/Write Logic n) 804 that receive and process the bit line signals to generate the results of the Boolean logic function/computations performed in each clock cycle. There are 2 read bit lines, RBL and RBLb with number of cells connected on these 2 read bit lines which are all connected to the BL Read/Write circuitry 804. BL Read/Write circuitry 804 also generate WBL and WBLb to drive the number of cells connected on these write bit lines.

In a read operation, WL generator 802 generates one or multiple RE and REb signals in each segment to generate a bit line signal or form a Boolen function on RBL and RBLb. The BL Read/Write Logic 204 processes the inputs from RBL and RBLb and sends the results back to its WBL/WBLb for writing/using in that cell, or to the neighboring BL Read/Write Logic for writing/using in that neighboring cell, or send it out of this processing array. Alternatively, the BL Read/Write logic 804 can store RBL result and/or RBLb result from its own bit line or from the neighboring bit line in a register or latch so that the next cycle Read/Write logic can perform logic with the latched RBL and/or RBLb result data.

In a write operation, the WL generator 802 generates one or more WE signals for the cells to be written and the BL Read/Write Logic 204 processes the write data, either from its own RBL or RBLb line, or from the neighboring RBL or RBLb line or from out of this processing array. The ability of BL Read/Write Logic 804 to process the data from the neighboring bit line means that the data can be shifting from one bit line to the neighboring bit line and one or more or all bit lines in the processing array may be shifting concurrently. The BL Read/Write Logic 804 can also decide not to write for a Selective Write operation based on RBL result and/or RBLb result. For example, WBL can be written to a data if RBL=1. If RBL=0, then a write is not performed.

Each BL Read/Write Logic 804 may have one or more Boolean logic circuits that perform various Boolean operations using the read bit lines as inputs. For example, each BL Read/Write Logic 804 may include one or more of AND, OR and/or XOR circuitry that may be implemented in various known manners and the disclosure is not limited to the particular implementation of the AND, OR and/or XOR circuitry in the BL Read/Write Logic 804. Like the processing array shown in FIG. 2, the processing array 800 in FIG. 8 may be use to implement a full adder that performs the computation in a single clock cycle using various embodiments of the bit line read/write logic 804 that will now be described in more detail.

Figure 9:
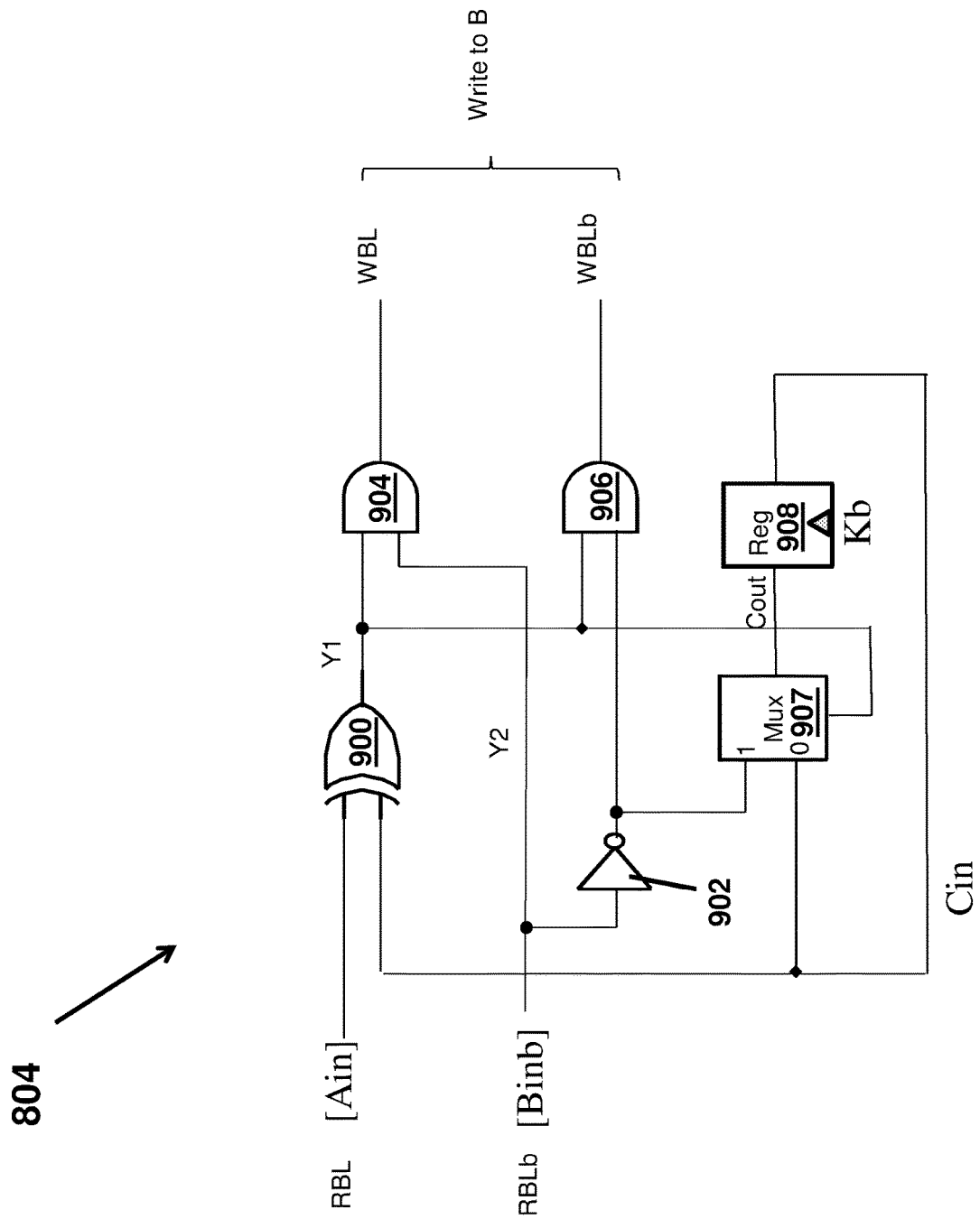
FIG. 9 illustrates an implementation of a first embodiment of the bit line read/write logic for the processing array shown in FIG. 8.

A non-limiting example of the circuitry of the BL read/write circuitry 804 that may be used in the processing array 800 in FIG. 8 is shown in FIG. 9 that performs the full adder operation in one clock cycle as described in EQ2 to EQ 6 above.

Using the processing array 800 in FIG. 8 with the bit line read/write logic 804 in FIG. 9, Ain is stored in a cell in RBL and is accessed by assertion of the RE signal to result in the RBL being Ain in the read operation. Bin is stored on another cell along the same bit line accessed by REb to result in Binb on RBLb. Cin is stored in the register or a latch in 908 in FIG. 9. For example, in FIG. 8, Ain is stored in cell 0i, Bin is stored in cell mi, and Cin is stored in the register or a latch inside BL Read/Write Logic i for the full adder operation performed along the RBLi, RBLib, where i is 0 to n. During a read operation, the cell statuses are as below:

1. Ain cell's RE=1, REb=0, Bin cell's RE=0, REb=1 during read operation in K clock high period resulting in:

a. $RBL = Ain$ \hfill (EQ14)

b. $RBLb = Binb$ \hfill (EQ15)

2. Cin is registered/latched in Reg 908

An XOR gate 900 in FIG. 9 outputs signal Y1=XOR (RBL, Cin)=XOR (Ain, Cin) as shown in EQ2 above. Signal Y2 is connected to RBLb as $$Y2 = NOT(Bin) \quad (EQ16)$$

Y1 is a selective write control signal. Thus, if Y1 is 1, AND gates 904 and 906 of the logic 804 are on, and:

$$WBL = Y2 = NOT(Bin) \quad (EQ17)$$

$$WBLb = Bin \quad (EQ18)$$

The operations performed in EQ14-18 perform the same functionality illustrated as EQ7-11 above and the full adder logic to store Bout into the cell of Bin is performed in 1 cycle in this embodiment as well. Inverter 902 has RBLb with Binb value as input to generate output with Bin value to send to mux 907 as input. The operation of Mux 907 and Reg 908 are the same as mux 607 and Reg 608 described in FIG. 6 described above. The full adder logic to store Cin into a register in the BL Read/Write Logic is performed in 1 cycle.

Figure 10:
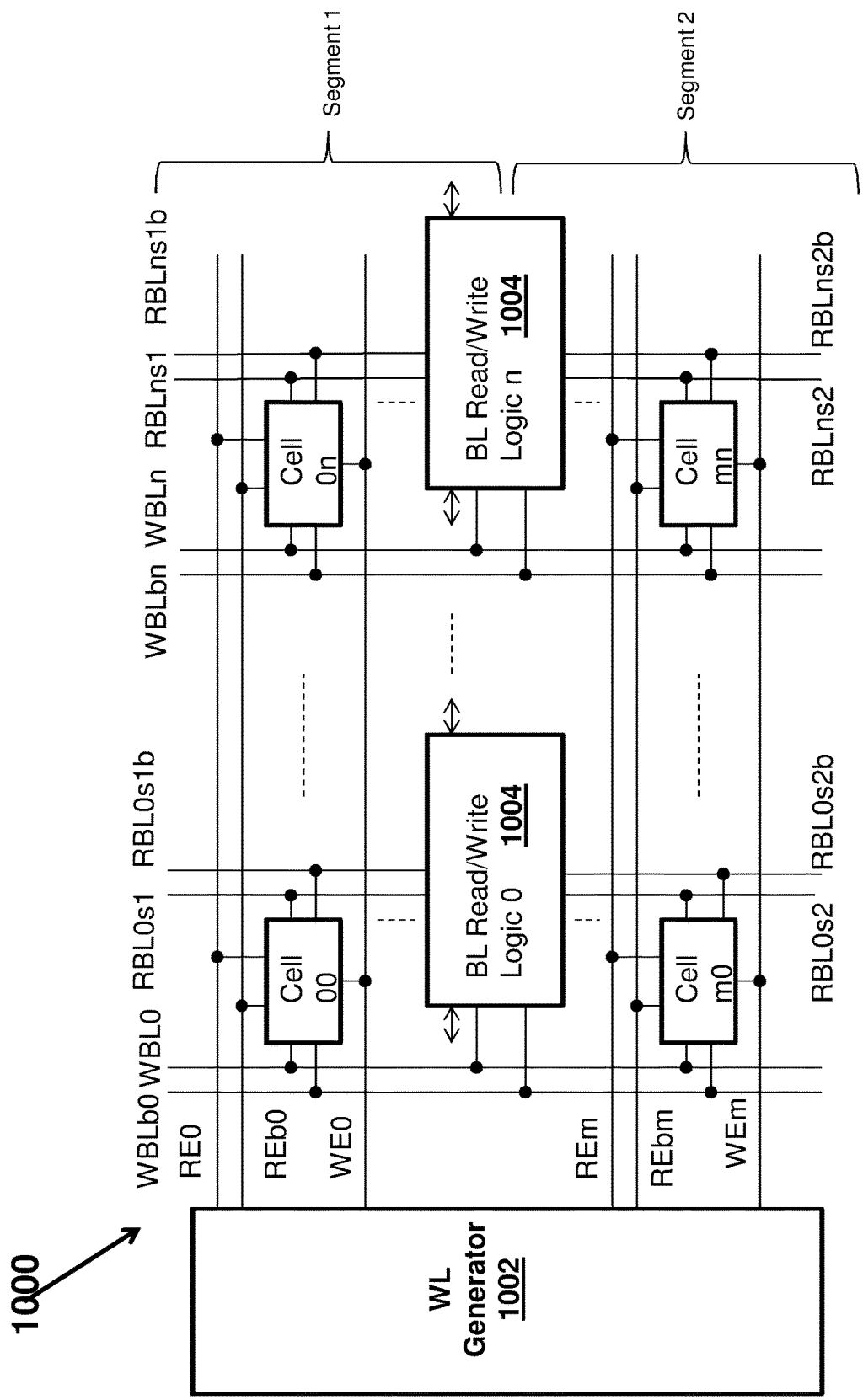
FIG. 10 illustrates an implementation of a third embodiment of a processing array that has a plurality of the complementary XOR cells shown in FIG. 7 and split segments.

FIG. 10 illustrates an implementation of a processing array 1000 that has a plurality of the complementary XOR cells shown in FIG. 7 and split segments of computational cells (segment 1 and segment 2) in the array with a plurality of bit line read/write logic circuits 1004 between the segments. Specifically, each read bit line (RBL0s1-RBLns1, RBL0s1b-RBLns1b, RBL0s2b-RBLns1b and RBL0s2b-RBLns2b) has split segments with each of the bit line (BL) read/write logic circuitry 1004 in the middle of the bit line. The processing array 1000 may have a word line generator 1002 that generates the word line signals/voltage levels and a plurality of bit line read/write logic circuits (BL Read/Write Logic 0, . . . , BL Read/Write Logic n) 1004 that receive and process the bit line signals to generate the results of the Boolean logic function/computations performed in each clock cycle. In this implementation, each bit line has two segments. Segment 1 has RBLs1 read bit line (RBL0s1, . . . , RBLns1) and RBLs1b read bit line (RBL0s1b, . . . , RBLns1b) with same number of cells connected on it which are all connected to the BL read/write circuitry 1004. Segment 2 has RBLs2 lines (RBL0s2, . . . , RBLns2) and RBLb read bit line (RBL0s2b, . . . , RBLns2b) with number of cells connected on it which are all connected to the BL read/write circuitry 1004. Segment 1 and 2 may have the same or different number of cells. In this example, WBL and WBLb are shared between the 2 segments.

In a read operation, WL generator 1002 generates one or multiple RE and REb signals in each segment to generate a bit line signal or form a Boolen function on RBLs1 and RBLs2. The BL Read/Write Logic 1004 processes the inputs from RBLs1, RBLs1b pair and RBLs2, RBLs2b pair and sends the results back to its WBL/WBLb for writing/using in that cell, or to the neighboring BL Read/Write Logic for writing/using in that neighboring cell, or sends it out of this processing array. Alternatively, the BL Read/Write logic 1004 can store RBL result and/or RBLb result from its own bit line or from the neighboring bit line in a register or latch so that the next cycle Read/Write logic can perform logic with the latched RBL and/or RBLb result data.

In a write operation, the WL generator 1002 generates one or more WE signals for the cells to be written and the BL Read/Write Logic 1004 processes the write data, either from its own RBL or RBLb line, or from the neighboring RBL or RBLb line or from out of this processing array. The ability of BL Read/Write Logic 1004 to process the data from the neighboring bit line means that the data can be shifting from one bit line to the neighboring bit line and one or more or all bit lines in the processing array may be shifting concurrently. The BL Read/Write Logic 1004 can also decide not to write for a Selective Write operation based on RBL result and/or RBLb result. For example, WBL can be written to a data if RBL=1. If RBL=0, then a write is not performed.

Each BL Read/Write Logic 1004 may have one or more Boolean logic circuits that perform various Boolean operations using the read bit lines as inputs. For example, each BL Read/Write Logic 104 may include one or more of AND, OR and/or XOR circuitry that may be implemented in various known manners and the disclosure is not limited to the particular implementation of the AND, OR and/or XOR circuitry in the BL Read/Write Logic 1004.

Figure 11:
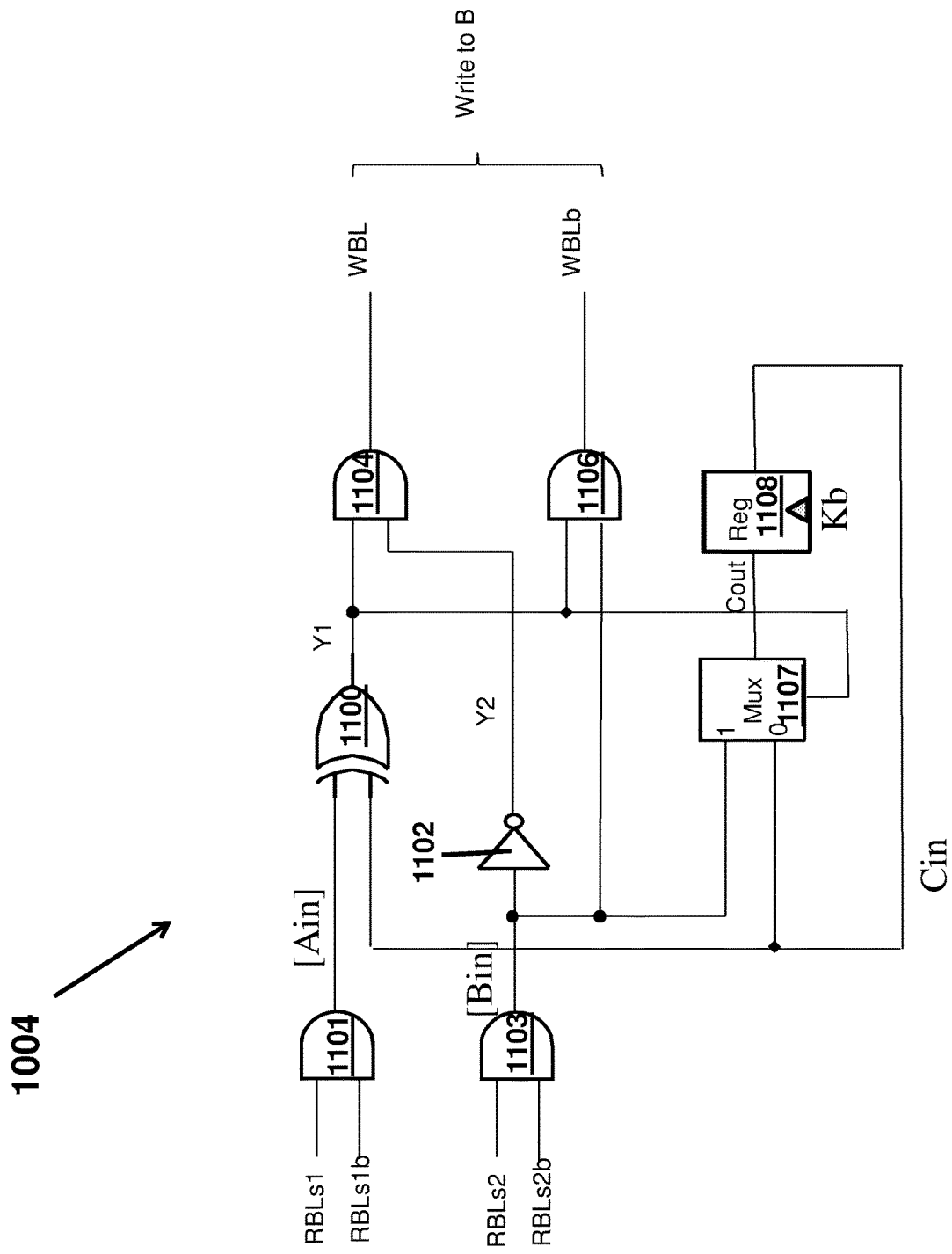
FIG. 11 illustrates an implementation of a first embodiment of the bit line read/write logic 1004 for the processing array shown in FIG. 10.

A non-limiting example of the circuitry of the BL read/write circuitry 1004 is shown in FIG. 11 that performs the full adder operation in one clock cycle as described in EQ2 to EQ6 above using the processing array 1000 shown in FIG. 10. In this implementation, Ain is stored in the cell in RBLs1 and is accessed by RE to result in RBLs1 being Ain in the read operation. RBLs1b is pre-charged high and stays high during read operation. An AND gate 1101 performs a logical AND of the signals on RBLs1 and RBLs1b to generate the output Ain to send to an XOR gate 1100. Bin is stored in the cell in RBLs2 and is accessed by RE to result in RBLs2 being Bin in the read operation. RBLs2b is pre-charged high and stays high during read operation. An AND gate 1103 performs a logical AND of the signals on RBLs2 and RBLs2b to generate the output Bin that is input to an Inverter 1102 to generate Y2. Cin is stored in the register or a latch 1008. The AND gates 1104, 1006 operate in the same manner as gates 604, 606 and MUX 1107 and Reg 1108 perform the same operation as the MUX 607 and Reg 608 described in FIG. 6 above. As described earlier, the full adder logic is performed in 1 cycle.

It may be desirable to use the processing array 1000 with BL read write logic 1004 in the middle of the bit line so the bit line length is half as long as compared to the processing array 800 shown in FIG. 8. The reduced bit line length can reduce the read access time of the processing array 1000 in FIG. 10 by discharging half of the bit line length, and the power is also reduced with only half of the bit line is active. The RBL length is same for the processing array in FIG. 2 and FIG. 10, but FIG. 10 uses complementary XOR cell that has the advantage of extra functions on the read bit lines such as Compare operation.

In the examples discussed above, the write bit lines are connected to both segment 1 and 2. Alternatively, however, the write bit lines may be divided into 2 segments like read bit line with additional segment write control to toggle either or both segments. This can reduce the power by writing only half of the bit lines.

Figure 12:
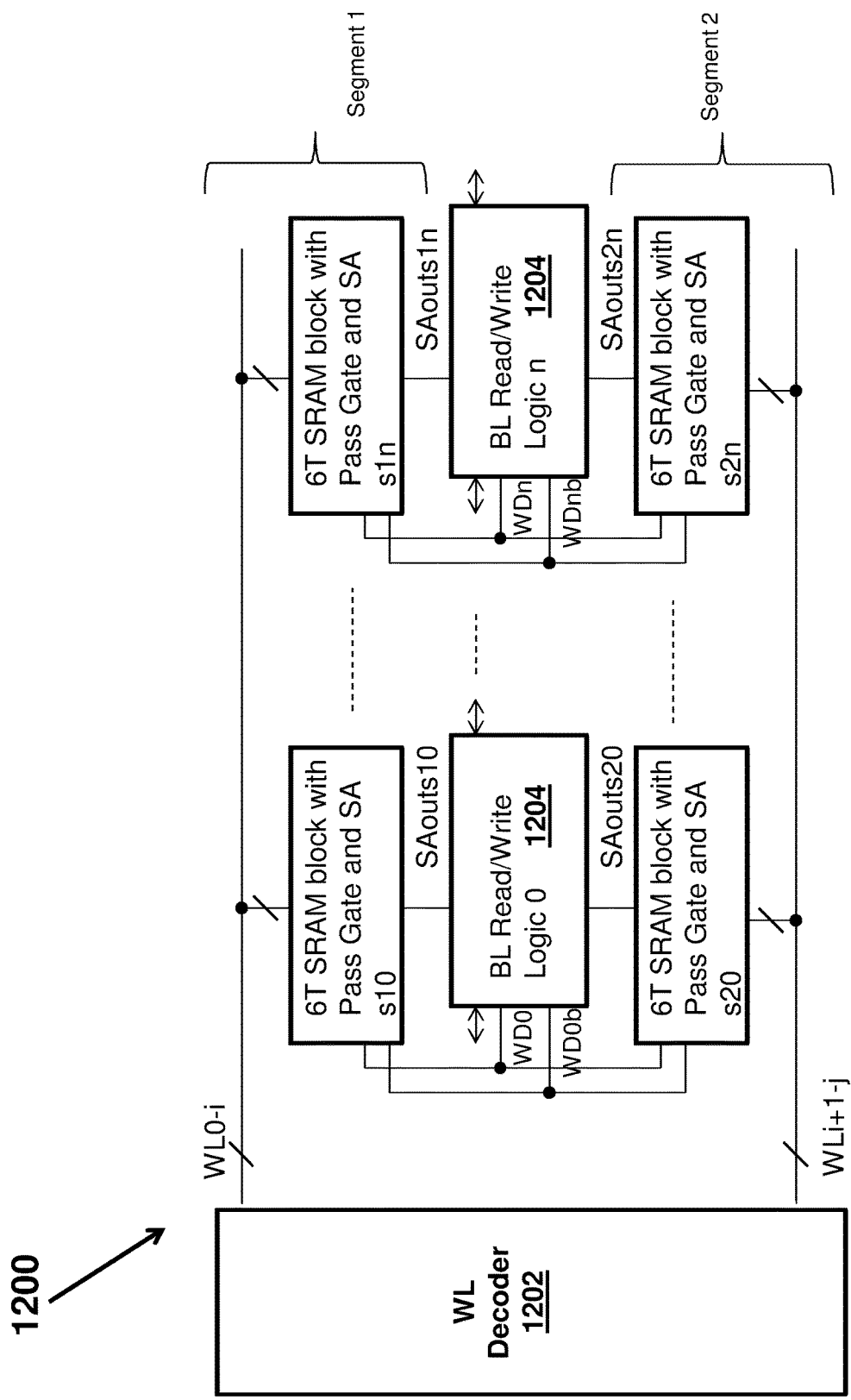
FIG. 12 illustrates an embodiment of the processing array that uses 6T SRAM blocks and segmented bit lines.
Figure 13:
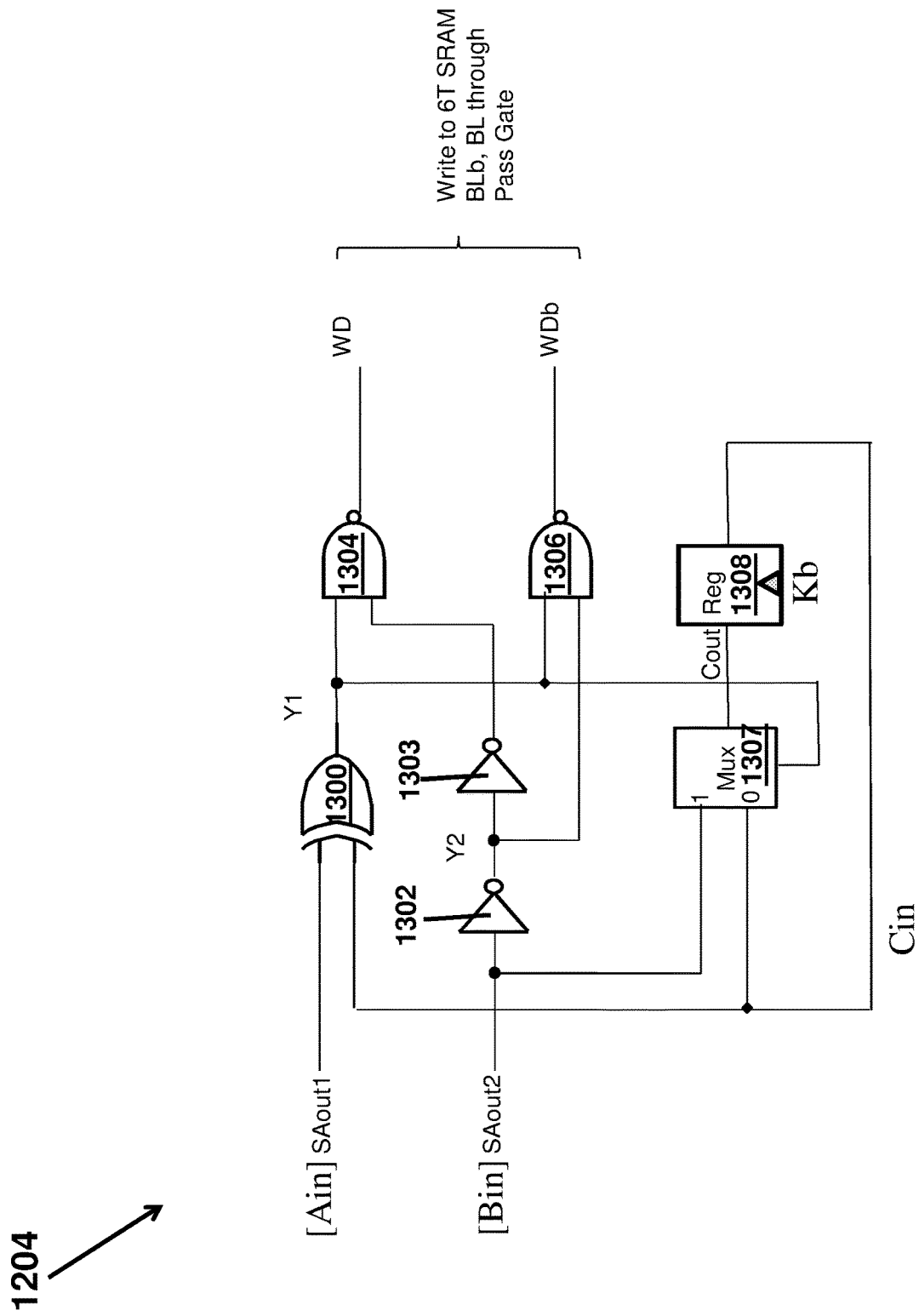
FIG. 13 illustrates more details of each bit line read/write logic of FIG. 12.

The preferred implementation described above using dual port or 3-port SRAM cell as memory cell in the processing array for 1 cycle full adder logic. However, a processing array using conventional 6T SRAM cell with slight modified BL Read/Write Logic can also perform 1 cycle full adder operation. The BL Read/Write Logic can be in the middle of 2 segments of 6T SRAM block (for example, U.S. Pat. No. 8,593,860) as shown in FIG. 12. Each of 6T SRAM block has numbers of word lines generated from WL Decoder 1202 and one or multiple of bit lines multiplexed through Pass Gate to generate sense lines to feed into Sense Amplifier to generate output SAout. Pass Gate will receive write data WD and WDb from BL Read/Write Logic 1204 and perform writing to 6T SRAM block in the write operation. Compare FIG. 12 and FIG. 2, 6T SRAM block with Pass Gate and SA replaces a column of dual port SRAM cell, Saout replaces RBL and WD, WDb replace WBL, WBLb. The slightly modified BL Read/Write Logic 1204 for full adder operation is shown in FIG. 13. In FIG. 13, SAout1 is Ain and SAout2 is Bin to generate Y1 as write control signal and Y2 as write data, same as FIG. 6. In 6T SRAM write operation, bit line and complementary bit line need to be high for not to perform the write operation in the write cycle, so WD and WDb data output to send to 6T SRAM block through PASS Gate need to be high if no write is performed. NAND gate 1304 and 1306 generate WD and WDb respectively with Y1 as write control signal. If Y1 is 0, no write is performed and WD and WDb are high. Y2 is write data, so Y2 is coupled to inverter 1303 and the inverter 1303 output is coupled to the other input of 1304 to generate WD. Y2 is also coupled to the other input of 1306 to generate WDb. The Mux 1307 and Reg 1308 for Cin and Cout operation is same as the function in FIG. 6's Mux 607 and Reg 608.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A processing array, comprising:
two read bit lines;
an array of memory cells having a plurality of rows of memory cells and a plurality of columns of memory cells, each memory cell having a storage cell, each read bit line connecting to a particular one or more columns of memory cells in the memory cell array;
a column of memory cells in the array being connected to the two read bit lines, wherein each memory cell in the column of memory cells has an isolation circuit that isolates the storage cell in the memory cell from the signals on the two read bit lines; and
bit line read/write circuitry connected to the two read bit lines that are connected to the column of memory cells, the bit line read/write circuitry having a latch and uses the two read bit lines and the latch to perform a full adder operation in a single clock cycle.

2. The processing array of claim 1, wherein a first input of the full adder operation is stored on a first read bit line of the two read bit lines and an inverted second input of the full adder operation is stored on a second read bit line of the two read bit lines and a carry input of the full adder operation is stored by the latch.

3. The processing array of claim 2, wherein the bit line read/write circuitry further comprises an XOR gate that combines the first input of the full adder operation and the carry input of the full adder operation and generates a Y1 output, an inverter that inverts the inverted second input of the full adder operation to generate a second input of the full adder operation, a first AND gate that logically ANDs the Y1 output and the inverted second input of the full adder operation to generate a first output and a second AND gate that logically ANDs the Y1 signal and the second input of the full adder operation to generate a second output.

4. The processing array of claim 3 further comprising a write bit line and a complementary write bit line connected to the column of memory cells and the bit line read/write circuitry connected to the column of memory cells and wherein the first output of the full adder operation is coupled to the write bit line and the second output is coupled to the complementary write bit line.

5. The processing array of claim 1, wherein the two read bit lines further comprises a read bit line and a complementary read bit line.

6. The processing array of claim 5, wherein each memory cell further comprises a static random access memory cell.

7. The processing array of claim 6, wherein the isolation circuit further comprises a first set of transistors coupled between the storage cell and read bit line and a second set of transistors coupled between the storage cell and the complementary read bit line.

8. The processing array of claim 6 further comprising a plurality of columns of memory cells wherein the memory cells in each column of memory cells are coupled to a different set of two read bit lines and a plurality of bit line read/write circuitry wherein each bit line read/write circuitry is coupled to a separate column of memory cells and the set of two read bit lines connected to that column of memory cells.

9. The processing array of claim 1, wherein each memory cell further comprises a nonvolatile memory cell.

10. A processing array, comprising: a plurality of read bit lines; an array of memory cells having a plurality of rows of memory cells and a plurality of columns of memory cells, each memory cell having a storage cell, each read bit line connecting to a column of memory cells in the memory cell array; the array of memory cells having a first segment comprising at least two rows of memory cells and a second segment comprising at least two different rows of memory cells, the first segment having each column of memory cells connected to at least two of the read bit lines and the second segment having each column of memory cells connected to at least two read bit lines; a plurality of bit line read/write circuitry positioned between the first segment and the second segment in the array of memory cells, each bit line read/write circuitry having inputs from the at least two read bit lines of the first segment and from the at least two read bit lines of the second segment; and wherein the processing array performs an operation using the read bit lines of the first and second segments in a single clock cycle, wherein the operation is a combined Boolean operation using the at least two read bit lines of the first and second segments.

11. The processing array of claim 10, wherein the operation is a full adder operation.

12. The processing array of claim 11, wherein each bit line read/write circuitry further comprises a logic gate that combines the signals from the at least two read bit lines of the first segment to generate a first input for the full adder operation, a logic gate that combines the signals from the at least two read bit lines of the second segment to generate a second input for the full adder operation and a register that stores a carry input for the full adder operation.

13. The processing array of claim 10, wherein the operation is a search operation.

14. The processing array of claim 10, wherein the operation is one of a NAND logical operation and an OR logical operation using at least two read bit lines of the second segment.

15. The processing array of claim 10, wherein the combined Boolean operation further comprises a Boolean operation using the at least two read bit lines of the first segment and a Boolean operation using the at least two read bit lines of the second segment.

16. A processing array, comprising:
two read bit lines;
an array of memory cells having a plurality of rows of memory cells and a plurality of columns of memory cells, each memory cell having a storage cell, each read bit line connecting to a particular column of memory cells in the memory cell array;
a column of memory cells in the array being connected to the two read bit lines, wherein two inputs of a full adder are stored;
each input of the full adder is read on one read bit line of the two read bit lines; and
bit line read/write circuitry connected to the two read bit lines that are connected to the column of memory cells, the bit line read/write circuitry having a latch and uses the two read bit lines and the latch to perform a full adder operation in a single clock cycle.

17. The processing array of claim 16, wherein a first input of the full adder is stored on a first read bit line of the two read bit lines and an inverted second input of the full adder is stored on a second read bit line of the two read bit lines and a carry input of the full adder is stored by the latch.

18. The processing array of claim 17, wherein the bit line read/write circuitry further comprises an XOR gate that combines the first input of the full adder and the carry input of the full adder and generates a Y1 output, an inverter that inverts the inverted second input of the full adder to generate a second input of the full adder, a first AND gate that logically ANDs the Y1 output and the inverted second input of the full adder to generate a first output and a second AND gate that logically ANDs the Y1 signal and the second input of the full adder to generate a second output.

19. The processing array of claim 18 further comprising a write bit line and a complementary write bit line connected to the column of memory cells and the bit line read/write circuitry connected to the column of memory cells and wherein the first output of the full adder is coupled to the write bit line and the second output is coupled to the complementary write bit line.

20. The processing array of claim 16, wherein the two read bit lines further comprises a read bit line and a complementary read bit line.

21. The processing array of claim 20, wherein each memory cell further comprises a static random access memory cell.

22. The processing array of claim 21, wherein the isolation circuit further comprises a first set of transistors coupled between the storage cell and read bit line and a second set of transistors coupled between the storage cell and the complementary read bit line.

23. The processing array of claim 21 further comprising a plurality of columns of memory cells wherein the memory cells in each column of memory cells are coupled to a different set of two read bit lines and a plurality of bit line read/write circuitry wherein each bit line read/write circuitry is coupled to a separate column of memory cells and the set of two read bit lines connected to that column of memory cells.

24. The processing array of claim 16, wherein each memory cell further comprises a nonvolatile memory cell.

25. A processing array, comprising: a plurality of read bit lines; an array of memory cells having a plurality of rows of memory cells and a plurality of columns of memory cells, each memory cell being a 6T SRAM block having a storage cell, a pass gate and a sense amplifier that generates a differential sense amplifier output signal from a bit line signal and a complementary bit line signal; the array of memory cells having a first segment comprising at least two rows of memory cells and a second segment comprising at least two different rows of memory cells; a plurality of bit line read/write circuitry positioned between the first segment and the second segment in the array of memory cells, each bit line read/write circuitry having inputs from each differential sense amplifier output signal of each memory cell in each segment; and wherein the processing array performs an operation using the sense amplifier output signals of the first and second segments in a single clock cycle, wherein the operation is a full adder operation.

26. The processing array of claim 25, wherein each bit line read/write circuitry further comprises an XOR gate that combines the first input of the full adder on the sense amplifier output signal of the first segment and a carry input and generates a Y1 output, a first AND gate that logically ANDs the Y1 output and a second input of the full adder stored by the sense amplifier signal of the second segment to generate a first output and a second AND gate that logically ANDs the Y1 signal and an inverted second input of the full adder to generate a second output.

27. The processing array of claim 26, wherein each bit line read/write circuitry further comprises a register that generates the carry input signal.

* * * * *